United States Patent [19]

Morikawa et al.

[11] Patent Number: 5,382,864
[45] Date of Patent: Jan. 17, 1995

[54] PIEZOELECTRIC BIMORPH TYPE ACTUATOR

[75] Inventors: Atsushi Morikawa; Jiro Inoue; Jun Tabota, all of Kyoto, Japan

[73] Assignee: Murata Manufacturing Co., Ltd., Kyoto, Japan

[21] Appl. No.: 14,895

[22] Filed: Feb. 8, 1993

[30] Foreign Application Priority Data

Feb. 6, 1992 [JP] Japan ................... 4-021156

[51] Int. Cl.⁶ ........................................... H01L 41/08
[52] U.S. Cl. .................................. 310/332; 310/363
[58] Field of Search ........................ 310/330–332, 310/321, 323, 363, 364

[56] References Cited

U.S. PATENT DOCUMENTS

| | | | |
|---|---|---|---|
| 4,349,762 | 9/1982 | Kitamura et al. | 310/332 |
| 4,363,993 | 12/1982 | Nishigaki et al. | 310/332 |
| 4,780,062 | 10/1988 | Yamada et al. | 310/321 X |
| 5,216,315 | 6/1993 | Terada et al. | 310/332 X |

*Primary Examiner*—Mark O. Budd
*Attorney, Agent, or Firm*—Ostrolenk, Faber, Gerb & Soffen

[57] ABSTRACT

A piezoelectric bimorph type actuator which, given a constant applied voltage, is capable of greater displacement without suffering from the problem of generating a smaller force of displacement or increasing the actuator size. The piezoelectric bimorph type actuator which is cantilevered, includes an electrode plate, a pair of piezoelectric plates provided on both sides of the electrode plate, and a voltage source for applying a voltage between each piezoelectric plate and the electrode plate so as to displace a free end thereof, wherein a ratio $t_2/t_1$ between the thickness $t_2$ of the electrode plate and the thickness $t_1$ of each piezoelectric plate is set to be 0.42–1.11 times as much as a ratio $E_2/E_1$ between the Young's modulus $E_2$ of the electrode plate and the Young's modulus $E_1$ of each piezoelectric plate.

13 Claims, 2 Drawing Sheets

PIEZOELECTRIC BIMORPH TYPE ACTUATOR

BACKGROUND OF THE INVENTION

1. Field of the Invention

The present invention relates to a piezoelectric bimorph type actuator, in particular, a piezoelectric bimorph type actuator suitable for use in the shutter mechanism of a camera.

2. Description of the Related Art

Piezoelectric bimorph type actuators of the type contemplated by the present invention have a piezoelectric plate provided on both sides of an electrode plate. In a typical case, one end of the actuator is cantilevered while the other end thereof is permitted to move freely. With this arrangement, a voltage is applied between each piezoelectric plate and the electrode plate so as to displace the free end. This displacement is typically used to drive a mechanism such as the shutter mechanism of a camera.

The displacement of conventional actuators can be increased by applying an increased voltage. One may readily figure out that in order to provide a sufficient stroke to drive the shutter mechanism of a camera under a constant voltage, it is necessary to extend the free end or reduce its thickness. However, the result of this approach is that the force (of displacement) generated at the free end is insufficient to drive the shutter mechanism.

Thus, in order to produce the necessary stroke while generating a desired force of displacement, the above-described approach may be combined with increasing the dimension of the actuator in the direction of width. In this case, however, the actuator size becomes bulky, potentially causing inconveniences when incorporating it into the camera which is a small device.

A further problem with the conventional approach of increasing the displacement of an actuator by extending its free end or reducing its thickness is that the resonant frequency (natural frequency) of the actuator decreases resulting in potential deterioration in its operation.

SUMMARY OF THE INVENTION

The present invention has been accomplished under these circumstances and has as an object to provide a piezoelectric bimorph type actuator which, given a constant applied voltage, is capable of greater displacement without suffering from the problems of generating a smaller force of displacement or increasing the actuator size.

The above and other objects of the present invention can be achieved by the provision of a piezoelectric bimorph type actuator which is cantilevered, including an electrode plate, a pair of piezoelectric plates provided on both sides of the electrode plate, and means for applying a voltage between each piezoelectric plate and said electrode plate so as to displace a free end thereof, wherein the Young's modulus $E_2$ of the electrode plate is larger than the Young's modulus $E_1$ of each piezoelectric plate.

Further, the objects of the invention can be achieved by the provision a piezoelectric bimorph type actuator which is cantilevered, including an electrode plate, a pair of piezoelectric plates provided on both sides of the electrode plate, and means for applying a voltage between each piezoelectric plate and the electrode plate so as to displace a free end thereof, wherein a ratio $t_2/t_1$ between the thickness $t_2$ of the electrode plate and the thickness $t_1$ of each piezoelectric plate is set to be 0.42–1.11 times, preferably 0.5–1.1 times as much as a ratio $E_2/E_1$ between the Young's modulus $E_2$ of the electrode plate and the Young's modulus $E_1$ of each piezoelectric plate.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below serve to explain the principles of the invention. In the accompanying drawings.

DESCRIPTION OF THE PREFERRED EMBODIMENTS

Figure 1:
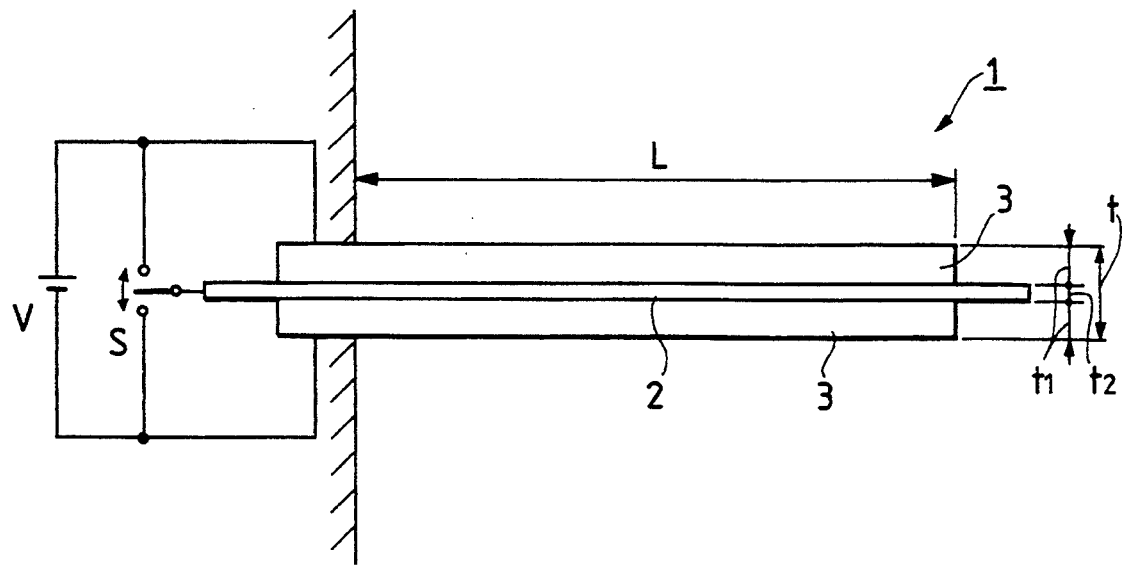
FIG. 1 is a side view showing schematically the construction of a piezoelectric bimorph type actuator according to an embodiment of the present invention.

The present invention will be described in detail with reference to the accompanying drawings. FIG. 1 is a side view of a piezoelectric bimorph actuator according to that embodiment. The piezoelectric bimorph type actuator generally designated by 1 comprises an electrode plate 2 made of an alloy that contains 42 percent nickel alloy, and a pair of piezoelectric plates 3 made of lead titanate zirconate (PZT) ceramic material. The piezoelectric plates 3 have the same thickness and are cemented to opposite sides of the electrode plate 2. The size of the actuator 1 is such that the effective length L is 38 mm, the total thickness t is 550 μm and the width is 5.5 mm.

The thickness ratio of the actuator 1 as expressed by $t_2/t_1$, or the ratio between the thickness $t_1$ of each piezoelectric plate 3 and the thickness $t_2$ of the electrode plate 2, is set as follows in terms of the ratio between the Young's moduli of the two plates, $E_2/E_1$.

The Young's modulus $E_1$ of piezoelectric plate 3 is $6.7 \times 10^{10}$ N/m² whereas the Young's modulus $E_2$ of electrode plate 2 made of an alloy that contains 42 percent nickel is $14.5 \times 10^{10}$ N/m²; hence, the ratio between the two values, $E_2/E_1$, is 2.16. The thickness ratio $t_2/t_1$ of the two plates is set to be 0.42–1.11 times as much as the value 2.16 of $E_2/E_1$, namely, at 0.9–2.4. Stated specifically, the thickness $t_1$ of each piezoelectric plate 3 is in the range of 125.0–189.7 μm whereas the thickness $t_2$ of the electrode plate 2 is in the range of 170.6–300.0 μm in association with the corresponding value of $t_1$. If the thickness ratio $t_2/t_1$ is set at values that satisfy the above-specified relationship with the Young's modulus ratio $E_2/E_1$, various versions of piezoelectric bimorph type actuator 1 that are made of the same material and which have identical appearance and shape will assume a maximum value for each of the amount of displacement and the force of displacement that is generated. The reasons are stated below.

The amount of displacement of a piezoelectric bimorph type actuator is generally expressed by the following equation:

$$\delta = NVL^2/2K \quad (1)$$

where $\delta$: the amount of displacement
$N$: $N = d_{31}E_1W(t_1+t_2)/2$ where $d_{31}$: piezoelectric constant,
$E_1$: the Young's modulus of each piezoelectric plate
$W$: the width of each piezoelectric plate,
$t_1$: the thickness of each piezoelectric plate, and
$t_2$: the thickness of the electrode plate.
$V$: applied voltage;
$L$: the effective length of the piezoelectric bimorph type actuator; and
$K$: the bending stiffness of the actuator.

The equation (1) is rewritten as:

$$\delta = A(N/K) \quad (2)$$

where $A$: $VL^2/2$

If A in equation (2) is a constant (i.e., the values of both L and V are constant), the amount of displacement $\delta$ will vary with the value of $N/K$.

Figure 2:
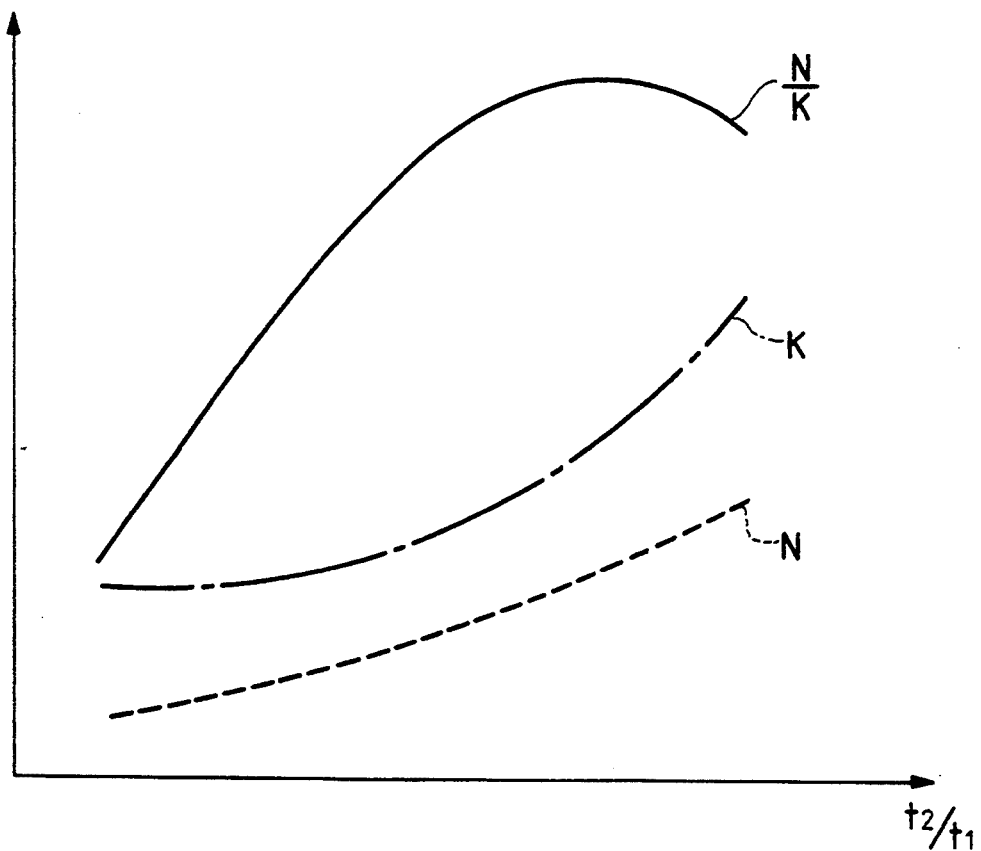
FIG. 2 is a graphical representation showing the relationships between a thickness ratio of a piezoelectric bimorph type actuator and each of three parameters that are related to the change in an amount of displacement $\delta$.

If, with the overall size of the piezoelectric bimorph type actuator being held constant, the thickness ratio $t_2/t_1$ between the electrode plate 2 and each piezoelectric plate 3 is varied, the values of N and K will change. Particularly in the case where the Young's modulus $E_2$ of the electrode plate 2 is greater than the Young's modulus $E_1$ of piezoelectric plate 3, the rate of increase in the value of K will exceed the rate of increase in the value of N at a certain point as shown in FIG. 2, so the value of N/K will have a maxima (in FIG. 2, the vertical axis represents the variations in the values of K, N and N/K in response to the change in the thickness ratio $t_2/t_1$). Since N/K has a maximum value, equations (1) and (2) indicate that the amount of displacement $\delta$ also has a maximum value. In other words, given the overall size of actuator, the ratio $t_2/t_1$ between the thicknesses of electrode plate 2 and piezoelectric plate 3 at which a maximum amount of displacement $\delta$ is obtained assumes a constant value.

The value of K also varies with the values of Young's moduli, $E_1$ and $E_2$, of piezoelectric plate 3 and electrode plate 2 and, thus, the degree of change in the value of K as seen in FIG. 2 changes with the ratio of Young's modulus $E_2/E_1$. Therefore, the thickness ratio $t_2/t_1$ at which a maximum value of displacement $\delta$, namely, a maxima of the value of N/K, is obtained will be determined by the ratio of Young's modulus $E_2/E_1$.

Figure 3:
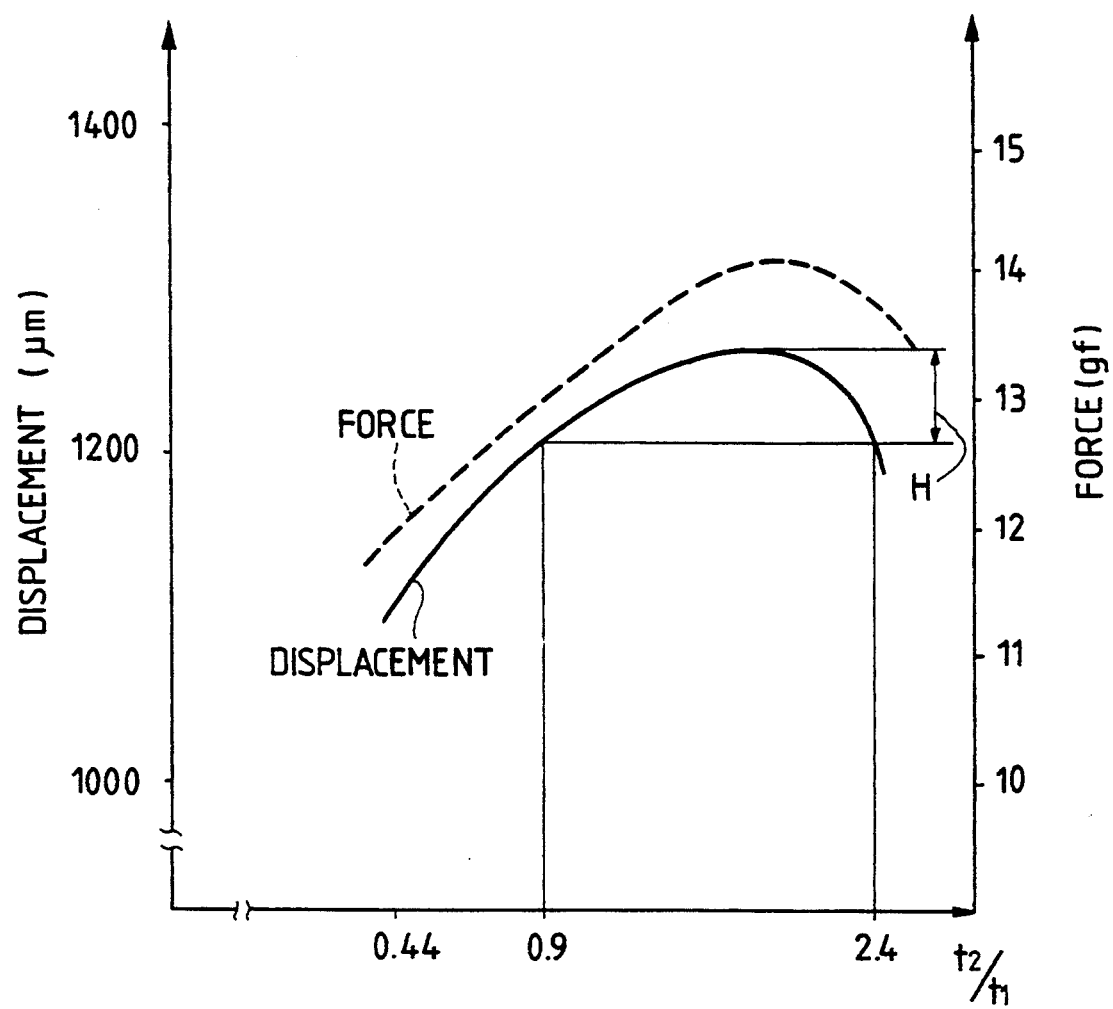
FIG. 3 is also a graphical representation showing the relationships between the thickness ratio of the piezoelectric bimorph type actuator according to the embodiment and each of the amount of displacement and a force caused by the displacement occurring in that actuator.

Based on these observations, the present inventors prepared various samples of a piezoelectric bimorph type actuator of the same size as the actuator 1 under discussion using the same material but with different values of thickness ratio $t_2/t_1$ and then measured the amount of displacement that occurs upon application of a constant voltage. The results are shown in FIG. 3. The measurements of $\delta$ were conducted with a drive circuit being operated in such a way that a voltage (V) of 160 volts is applied to the actuator 1 via switch S as shown in FIG. 1. The curve indicated by a solid line in FIG. 3 represents the variation of displacement $\delta$ in response to the change in the thickness ratio $t_2/t_1$.

All samples of piezoelectric bimorph type actuator under measurement are completely identical to the version designed in accordance with the embodiment. It is composed of two PZT piezoelectric plates cemented to an electrode plate made of an alloy that contains 42 percent nickel, with the size being such that the effective length (L) is 38 mm, the width is 5.5 mm and the overall thickness (t) is 550 μm. As already mentioned in connection with the embodiment, $E_2/E_1$ or the ratio between the Young's moduli of an alloy that contains 42 percent nickel and PZT is 2.16.

As is clear from FIG. 3, the amount of displacement $\delta$ has a maximum value and at values in the vicinity of the maxima, $\delta$ changes following a comparatively flat and smooth curve. If it is assumed that the effective range, H, of displacement $\delta$ extends from 95% to 100% of the maxima, the thickness ratio $t_2/t_1$ at which the amount of displacement $\delta$ is within the effective range H will lie between 0.9 and 2.4. Since the ratio $E_2/E_1$ of Young's modulus for each of the actuator samples under measurement, is 2.16, the following relationship holds good between the thickness ratio for producing the effective amount of displacement $\delta(t_2/t_1=0.9-2.4)$ and the ratio of Young's modulus $E_2/E_1$ $(=2.16)$:

$0.42 \times (E_2/E_1) \leq t_2/t_1$ producing the effective amount of displacement $\leq 1.11 \times (E_2/E_1)$.

To put it simply, this relation states that the useful (maximum) amount of displacement $\delta$ is attained if the thickness ratio $t_2/t_1$ is included within the range over which it is 0.42–1.11 times as much as the ratio of Young's modulus $E_2/E_1$. In the light of this observation, the piezoelectric plates 3 and electrode plate 2 in the actuator 1 of the embodiment under consideration have thicknesses of the values already specified above. Stated more specifically, the thickness $t_1$ of each piezoelectric plate is within the range of 125.0–189.7 μm whereas the thickness $t_2$ of the electrode plate is calculated as 170.6–300.0 μm by subtracting $(2 \times t_1)$ from the overall thickness. By adjusting the thickness ratio $t_2/t_1$ to assume values within the range determined by those values, the amount of displacement $\delta$ will assume a substantially maximum value.

When performing the experiment for measuring the amount of displacement in the manner described above, the present inventors also measured the force of displacement generated and the results are plotted in FIG. 3 by the curve indicated by a dashed line. As the curve shows, the generated force of displacement has a maximum value as the amount of displacement $\delta$ and the position of that maxima is substantially the same as that of the amount of displacement $\delta$. One can, therefore, conclude that if the thickness ratio $t_2/t_1$ is set to lie within the range of 0.42–1.11 times, preferably 0.5–1.1 times as much as the ratio $E_2/E_1$ (the ratio of Young's modulus) as in the present invention, a substantially maximum value can be attained not only for the amount of displacement $\delta$ but also for the generated force of displacement.

As described on the foregoing pages, the piezoelectric bimorph type actuator of the present invention has the advantage that, given a constant applied voltage, it is capable of producing a greater amount of displacement without requiring a change in shape or causing a drop in the generated force of displacement. This has made it possible to meet the requirements for improved operating characteristics and smaller size, which have heretofore been difficult to satisfy at the same time.

In addition, the operating characteristics of the piezoelectric bimorph type actuator can be improved without modifying the shape parameters such as length and thickness of the device taken as a whole, and hence there is no chance of its resonant frequency becoming low enough to cause deterioration in response characteristics, with the resulting improvement in the characteristics of control over driving on a closed-loop system.

What is claimed is:

1. A piezoelectric bimorph type actuator which is cantilevered, comprising an electrode plate, a pair of piezoelectric plates provided on both sides of said electrode plate, and means for applying a voltage between each piezoelectric plate and said electrode plate so as to displace a free end thereof, wherein a ratio $t_2/t_1$ between the thickness $t_2$ of said electrode plate and the thickness $t_1$ of each piezoelectric plate is set to be 0.42–1.11 times as much as a ratio $E_2/E_1$ between the Young's modulus $E_2$ of said electrode plate and the Young's modulus $E_1$ of each piezoelectric plate.

2. The piezoelectric bimorph type actuator as defined in claim 1 wherein the ratio $E_2/E_1$ is substantially 0.9–2.4.

3. The piezoelectric bimorph type actuator as defined in claim 1 wherein the thickness $t_1$ of said each piezoelectric plate is substantially 125.0–189.7 μm and the thickness $t_2$ of said electrode plate is substantially 170.6–300.0 μm.

4. The piezoelectric bimorph type actuator as defined in claim 1 wherein said each piezoelectric plate is made of lead titanate zirconate (PZT) based ceramic material and said electrode plate is made of an alloy that contains 42 percent nickel.

5. A piezoelectric bimorph type actuator which is cantilevered, comprising an electrode plate, a pair of piezoelectric plates provided on both sides of said electrode plate, and means for applying a voltage between each piezoelectric plate and said electrode plate so as to displace a free end thereof, wherein the Young's modulus $E_2$ of said electrode plate is larger than the Young's modulus $E_1$ of each piezoelectric plate and a ratio $t_2/t_1$ between a thickness $t_2$ of said electrode plate and a thickness $t_1$ of each piezoelectric plate is set to be 0.42–1.11 times as much as a ratio $E_2/E_1$ between the Young's modulus $E_2$ of said electrode plate and the Young's modulus $E_1$ of each piezoelectric plate.

6. The piezoelectric bimorph type actuator as defined in claim 5 wherein the ratio $E_2/E_1$ is substantially 0.9–2.4.

7. The piezoelectric bimorph type actuator as defined in claim 5 wherein the thickness $t_1$ of said each piezoelectric plate is substantially 125.0–189.7 μm and the thickness $t_2$ of said electrode plate is substantially 170.6–300.0 μm.

8. The piezoelectric bimorph type actuator as defined in claim 5 wherein said each piezoelectric plate is made of lead titanate zirconate (PZT) ceramic material and said electrode plate is made of an alloy that contains 42 percent nickel.

9. A piezoelectric bimorph type actuator which is cantilevered, comprising an electrode plate, a pair of piezoelectric plates provided on both sides of said electrode plate, and means for applying a voltage between each piezoelectric plate and said electrode plate so as to displace a free end thereof, wherein the Young's modulus $E_2$ of said electrode plate is larger than the Young's modulus $E_1$ of each piezoelectric plate and a ratio $t_2/t_1$ between a thickness $t_2$ of said electrode plate and a thickness $t_1$ of each piezoelectric plate is set to be 0.42–1.11 times as much as the ratio $E_2/E_1$.

10. The piezoelectric bimorph type actuator as defined in claim 9 wherein said electrode plate is made of metal.

11. The piezoelectric bimorph type actuator as defined in claim 9 wherein the ratio $E_2/E_1$ is substantially 0.9–2.4.

12. The piezoelectric bimorph type actuator as defined in claim 9 wherein the thickness $t_1$ of said each piezoelectric plate is substantially 125.0–189.7 μm and the thickness $t_2$ of said electrode plate is substantially 170.6–300.0 μm.

13. The piezoelectric bimorph type actuator as defined in claim 9 wherein said each piezoelectric plate is made of lead titanate zirconate (PZT) based ceramic material and said electrode plate is made of an alloy that contains 42 percent nickel.

* * * * *